(12) United States Patent
Dubey et al.

(10) Patent No.: US 6,560,742 B1
(45) Date of Patent: May 6, 2003

(54) PARALLEL SYSTEM AND METHOD FOR CYCLIC REDUNDANCY CHECKING (CRC) GENERATION

(75) Inventors: Pradeep Kumar Dubey, New Delhi (IN); Sanjay Mukund Joshi, Baltimore, MD (US); Marc Adam Kaplan, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/457,950

(22) Filed: Dec. 9, 1999

(51) Int. Cl.[7] .............................................. H03M 13/00

(52) U.S. Cl. ........................ 714/757; 714/781; 714/807

(58) Field of Search ................................ 714/757, 758, 714/807, FOR 102, 808, 781

(56) References Cited

U.S. PATENT DOCUMENTS 6,223,320 B1 * 4/2001 Dubey et al. ............... 714/757

OTHER PUBLICATIONS

Parallel CRC generation, Albertengo, G. Sisto, R.; IEEE Micro, vol.: 10 Issue: 5, Oct. 1990, pp.: 63–71.*
A Painless Guide to CRC Error Detection Algorithms, Williams, Ross; Version 3, Aug. 19, 1993.*

* cited by examiner

Primary Examiner—Albert Decady
Assistant Examiner—Matthew C. Dooley
(74) Attorney, Agent, or Firm—F. Chau & Associates, LLP

(57) ABSTRACT

The present invention involves a method for generating a partial Cyclic Redundancy Checking (CRC) value of a first interval of data in a digital data stream. The method includes the step of loading a precomputed CRC value corresponding to a one bit followed by a predetermined number of zeros. The predetermined number of zeros correspond to the number of digits of a polynomial minus one. The first interval of data is partitioned into a plurality of bits. The precomputed CRC value corresponding to the one bit followed by the predetermined number of zeros is enabled, for each of the plurality of bits having a value of one. The enabled, precomputed CRC values are combined to generate the partial CRC value of the first interval of data. Advantageously, multiple copies of the process may be executed in parallel to achieve a large speed-up.

33 Claims, 7 Drawing Sheets

PARALLEL SYSTEM AND METHOD FOR CYCLIC REDUNDANCY CHECKING (CRC) GENERATION

BACKGROUND

1. Technical Field

The present invention relates generally to the field of error correction in digital communication systems and, in particular, to a parallel system and method for cyclic redundancy checking (CRC) generation. The bulk of the data (in a digital data stream) is processed using the system/method of the present invention to generate a partial CRC. This partial CRC, along with the last few data bits of the digital data stream, may then be used by a conventional CRC generating algorithm to compute the CRC of the entire digital data stream.

2. Background Description

Digital communications between computers form a vital part of the Internet (as well as other networks). Unfortunately, in many situations, the transmitted data is corrupted by the time it is received by a receiver. Thus, the detection of transmission errors is essential in such communications.

Cyclic Redundancy Checking (CRC) is a commonly used error-detection scheme. It is particularly useful in areas involving digital data storage and transmission.

CRC is a type of checksum transmitted with data. The CRC is computed as the remainder when a "data" number is divided by a "standard" number. The CRC is then appended to the data. At the receiver, the CRC of the whole sequence, the data followed by its CRC, is computed again. For an errorless transmission, the computed CRC at the receiver should be zero. Non-zero CRC at the receiver implies a transmission error with a high probability.

Since the data size is usually quite large, performing an integer division is not an easy task. An alternate way of looking at this division is using polynomials. The digits of the numbers form the coefficients of various powers in the polynomials. The degree of such a polynomial is the number of digits in the corresponding code standard encode number minus one.

The "standard" number is known as a generating polynomial. Several generating polynomials have been standardized. Some of these standardized generating polynomials are described by R. N. Williams, in "A Painless Guide to CRC Error Detection Algorithms", ftp://ftp.rocksoft.com/clients/rocksoft/papers/crc_v3.txt, Version 3, Aug. 19, 1993. It is to be noted that polynomial division can be carried out in binary, modulo-2 arithmetic. Further, polynomial division can also be broken down into a series of XOR operations.

A review of current CRC generation software algorithms is provided in the above referenced article by R. N. Williams. Nonetheless, a brief review of current CRC generation algorithms will now be given.

The basic CRC generation algorithm is the bit-wise algorithm. FIG. 1 is a block diagram illustrating the bit-wise algorithm 100 according to the prior art. The throughput of this algorithm is one input data bit per cycle. The input data bits are appended by M zero bits, wherein M is the number of bits in the CRC. The bit-wise algorithm is described in further detail by T. B. Pei and C. Zukowski, in "High-speed Parallel CRC Circuits in VLSI", IEEE Trans. Communications, Vol. 40, No. 4, pp. 653–57, April 1992.

Software implementation of the bit-wise algorithm becomes efficient if a number of bits are grouped together, usually as an 8-bit byte as described by R. N. Williams in the above-referenced article. These algorithms are referred as table-lookup algorithms, and are discussed in the following articles: G. Griffiths and G. C. Stones, "The Tea-leaf Reader Algorithm: An Efficient Implementation of CRC-16 and CRC-32", Communications of the ACM, Vol. 30, No. 7, pp. 617–20, July 1987; A. Perez, "Byte-wise CRC Calculations", IEEE Micro, Vol. 3, No. 3, pp. 40–50, June 1983; T. V. Ramaabadran and S. V. Gaitonde, "A Tutorial on CRC Computations", IEEE Micro, Vol. 8, No. 4, pp. 62–75, August 1988; D. V. Sarwate, "Computation of Cyclic Redundancy Checks via Table Look-up", Communications of the ACM, Vol. 31, No. 8, pp. 1008–13, August 1988; and R. N. Williams, "A Painless Guide to CRC Error Detection Algorithms", ftp://ftp.rocksoft.com/clients/rocksoft/papers/crc_v3.txt. Version 3, Aug. 19, 1993.

Another approach in software implementation uses a shift-and-add method described by D. C. Feldmeier, in "Fast Software Implementation of Error Correcting Codes", IEEE/ACM Transactions on Networking, Vol. 3, No. 6, pp. 640–51 December 1995.

U.S. Ser. No. 09/021/516, entitled "Efficient CRC Generation Utilizing Parallel Table Lookup Operations", filed on Feb. 10, 1998, assigned to the assignee herein, the disclosure of which is incorporated herein by reference, describes a software algorithm for CRC generation using parallel table lookup operations, which can be done very efficiently using SIMD-style vector units.

It is to be noted that hardware implementations are popular for computing the CRC. Using such implementations, the basic bit-wise algorithm can be accelerated. For example, the bit-wise algorithm was treated as an M-tap finite-impulse-response filter, by G. Albertengo and R. Sisto, in "Parallel CRC Generation", IEEE Micro, Vol, 10, No. 5, pp. 63–71, October 1990. Then, the operation was converted into M parallel operations via the Z-transform method from digital signal processing. The Z-transform method is described by A. V. Oppenheim and R. W. Schafer, in Discrete-Time Signal Processing, Prentice Hall, Englewood Cliffs, N.J., USA, 1989.

A number of shift-and-subtract operations were merged in processing M bits by T. B. Pei and C. Zukowski, in "High-speed Parallel CRC Circuits in VLSI", IEEE Trans. Communications, Vol. 40, No. 4, pp. 653–57, April 1992. Different hardware implementations of their algorithm are described by: R. F. Hobson and K. L. Cheung, in "High-performance CMOS 32-bit Parallel CRC Engine", IEEE Journal of Solid-State Circuits, Vol. 34, No. 2, pp. 233–35, February 1999; and A. Maniatopoulous, T. Antonakopoulos, and V. Makios, in "Single-bit Error-correction Circuit for ATM Interfaces", Electronic Letters, Vol. 31, No. 8, pp. 617–18, Apr. 13, 1995.

The table-lookup algorithm was also implemented in hardware as described by: R. J. Glaise and X. Jacquart, in "Fast CRC Calculation", Proc. 1993 IEEE International Conference on Computer Design: VLSI in Computers and Processors, Cambridge, Mass., USA, pp. 602–05, Oct. 3–6 1993; and S. M. Sait and W. Hasan, in "Hardware Design and VLSI Implementation of a Byte-wise CRC Generator Chip", IEEE Transactions on Consumer Electronics, Vol. 41, No. 1, pp. 195–200, February 1995.

Fast algorithms for CRC computation that are treated as finite state machines are described by: B. Castagnolo and M. Rizzi, in "High-speed Error Correction Circuit Based on Iterative Cells", International Journal of Electronics, Vol. 74, No. 4, pp. 529–40, April 1993; M. C. Nielson, in "Method for High-speed CRC Computation", IBM Technical Disclosure Bulletin, Vol. 27, No. 6, pp. 3572–76, November 1984; and A. Sobski and A. Albicki, in "Partitioned and Parallel Cyclic Redundancy Checking", Proc. 36$^{th}$ Midwest Symposium on Circuits and Systems, Detroit, Mich., USA, Vol. 1, pp. 538–41, Aug. 16–18, 1993. A scheme using asynchronous CMOS hardware is described by S. H. Li and C. A. Zukowski, "Self-timed Cyclic Redundancy Check (CRC) in VLSI", Proc. 40$^{th}$ Midwest Symposium on Circuits and Systems, Sacramento, Calif. USA, Vol. 2, pp. 1021–23, Aug. 3–6, 1997. The speed-ups obtained in all these algorithms were less than or equal to a factor of M (i.e., the number of bits in the CRC).

Accordingly, it would be desirable and highly advantageous to have a CRC generation system and method that can obtain speed-up factors beyond M.

SUMMARY OF THE INVENTION

The present invention is directed to a parallel system and method for CRC generation. By processing K bits of data (the number of bits that can be delivered per cycle) in one iteration, the present invention allows for speed-up factors to be obtained well beyond the CRC size. In optimized embodiments of the present invention, the speed-up is increased by a factor of K.

According to one aspect of the invention, there is provided a method for generating a partial Cyclic Redundancy Checking (CRC) value of a first interval of data in a digital data stream. The method includes the step of loading a precomputed CRC value corresponding to the one bit followed by a predetermined number of zeros. The predetermined number of zeros correspond to the number of digits of a polynomial minus one (i.e., the degree of the polynomial). The first interval of data is partitioned into a plurality of bits. The precomputed CRC value corresponding to the one bit followed by the predetermined number of zeros is enabled, for each of the plurality of bits having a value of one. The enabled, precomputed CRC values are combined to generate the partial CRC value of the first interval of data.

According to a second aspect of the invention, the method further includes the step of executing the same number of copies of the method as intervals of data in the digital data stream to generate partial CRC values of the intervals of data in the digital data stream.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

The present invention is directed to a parallel system and method for CRC generation. The bulk of the data (in a digital data stream) is processed using the system/method of the present invention to generate a partial CRC. This partial CRC, along with the last few data bits of the digital data stream, may then be used by a conventional CRC generating algorithm to compute the CRC of the entire digital data stream.

Figure 1:
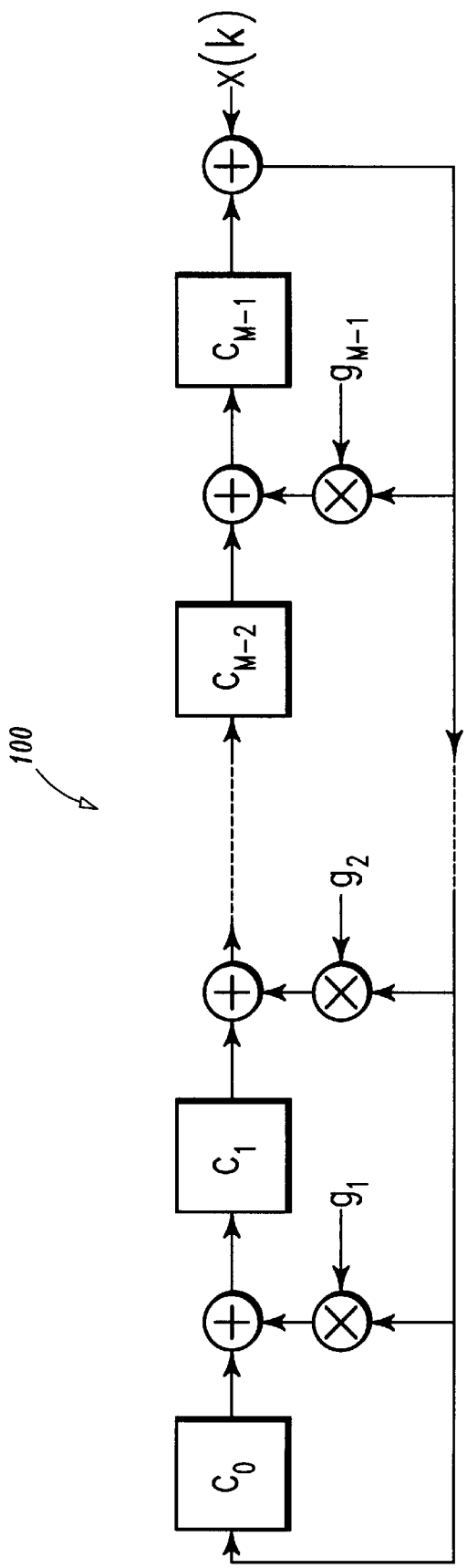
FIG. 1 is a diagram illustrating the bit-wise algorithm according to the prior art.

To facilitate a clear understanding of the present invention, definitions of terms employed herein will now be given. M is the number of bits in the CRC. K is the number of bits that can be delivered per cycle. A generating polynomial is simply the divisor in a division performed to determine the CRC value for the one bit. The speed-up or speed-up factor is the number of cycles used by the basic bitwise algorithm (shown in FIG. 1) divided by the number of cycles taken by the system/method of the present invention to compute the CRC of the same data.

It is to be appreciated that the present invention allows for speed-up factors to be obtained well beyond the CRC size, by processing K bits of data in one iteration. In optimized embodiments of the present invention, the speed-up is increased by a factor of K.

It is to be noted that the present invention does not obtain the CRC of the data at the end of each iteration. Rather, after the last iteration, the remaining data and the partial CRCs of the data processed thus far are further processed using an existing CRC computation algorithm.

As described below, the speed-up factor of the present invention depends on the number of bits that can be delivered in one iteration, K, and the maximum number of inputs possible to an XOR gate. The present invention may be implemented such that several copies of the present invention are executed in parallel, to obtain a speed-up factor of K over the bit-serial algorithm. It is to be appreciated that the present invention has an unlimited theoretical speed-up, and is not limited by the CRC size (in contrast to existing algorithms).

It is to be understood that the present invention may be implemented in various forms of hardware, software, firmware, special purpose processors, or a combination thereof. The present invention may be implemented in software as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof) which is executed via the operating system. In addition, various other peripheral devices may be connected to the computer platform such as an additional data storage device and a printing device.

It is to be further understood that, because some of the constituent system components and method steps depicted in the accompanying Figures may be implemented in software, the actual connections between the system components (or the process steps) may differ depending upon the manner in which the present invention is programmed. Moreover, because some of the constituent system components and method steps depicted in the accompanying Figures may be implemented in both hardware and software, items bearing the same reference numeral may be referred to in manner indicative of both hardware and software. Given the teachings of the invention provided herein, one of ordinary skill in the related art will be able to contemplate these and similar implementations or configurations of the present invention.

Figure 2:
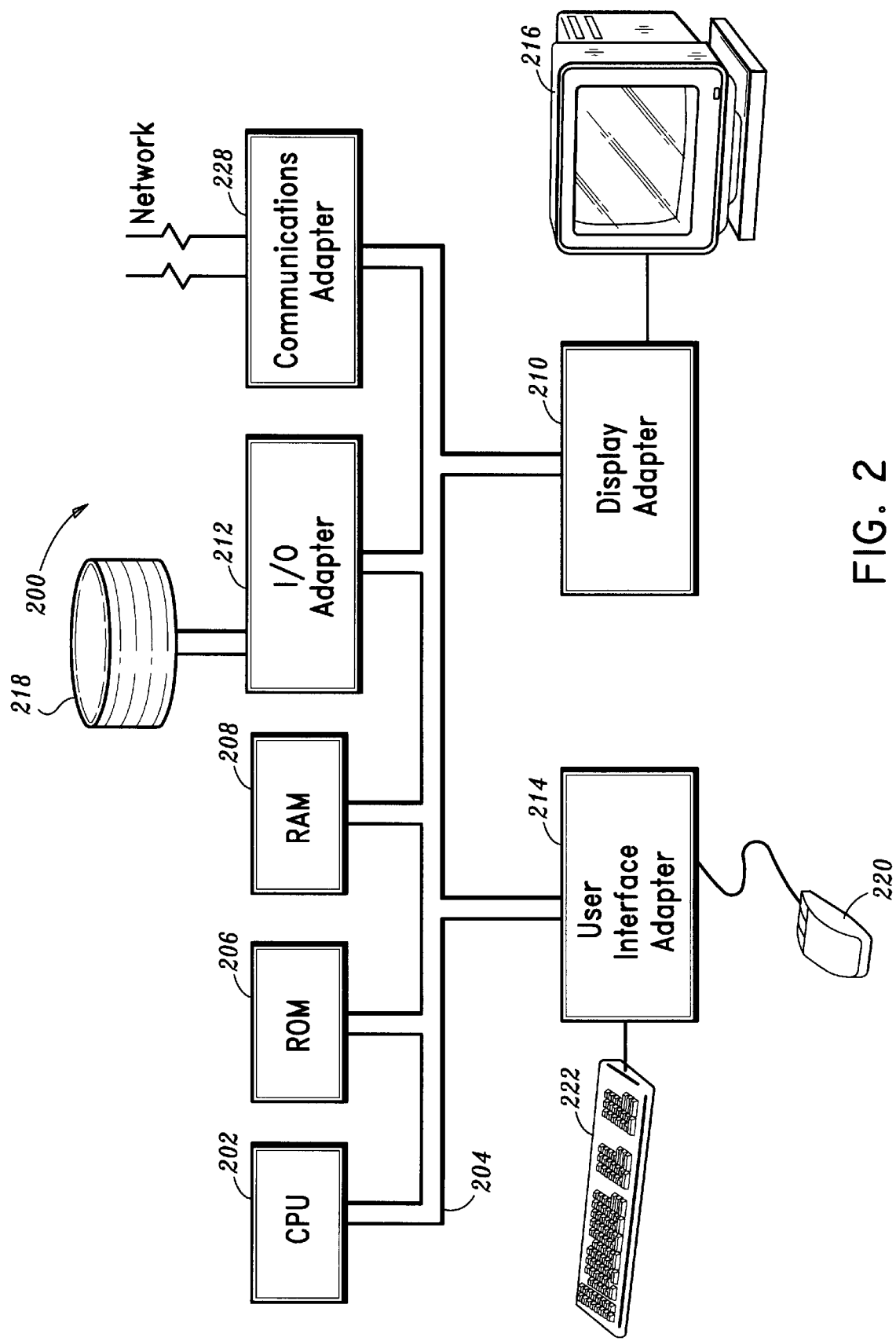
FIG. 2 is a block diagram of a computer processing system to which the present invention may be applied according to an embodiment of the present invention.

FIG. 2 is a block diagram of a computer processing system 200 to which the present invention may be applied according to an embodiment of the present invention. The system 200 includes at least one processor (CPU) 202 operatively coupled to other components via a system bus 204. A read only memory (ROM) 206, a random access memory (RAM) 208, a display adapter 210, an I/O adapter 212, and a user interface adapter 214 are operatively coupled to system bus 204.

A display device 216 is operatively coupled to system bus 204 by display adapter 210. A disk storage device (e.g., a magnetic or optical disk storage device) 218 is operatively couple to system bus 204 by I/O adapter 212.

A mouse 220 and keyboard 222 are operatively coupled to system bus 204 by user interface adapter 214. The mouse 220 and keyboard 222 may be used to input and output information to and from system 200. The system 200 also includes a communications adapter 228 operatively coupled to system bus 204 for facilitating communication with a remote network.

A general description of the present invention will now be provided to introduce the reader to the concepts of the invention. Subsequently, more detailed descriptions of various aspects of the invention will be provided.

Figure 3:
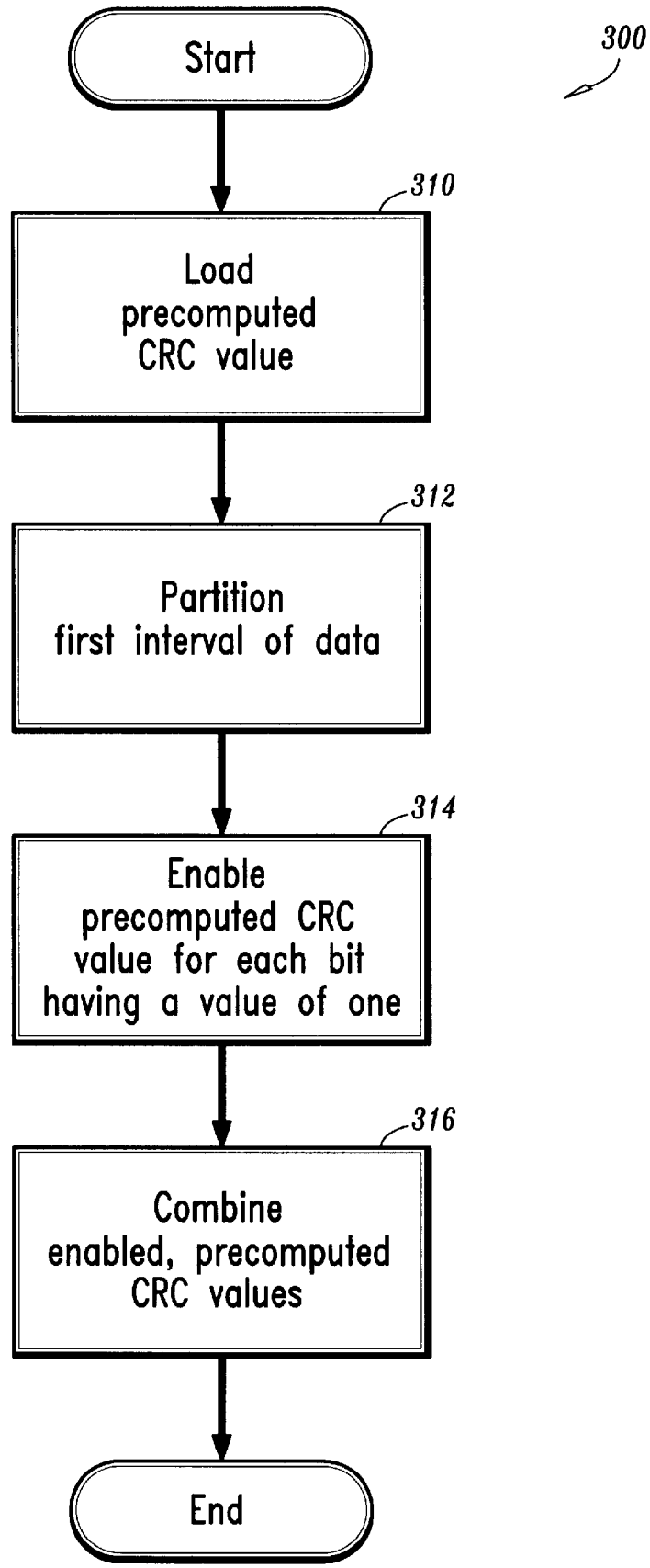
FIG. 3 is a diagram illustrating a method for generating a partial Cyclic Redundancy Checking (CRC) value of a first interval of data in a digital data stream according to an illustrative embodiment of the present invention.

The general description is provided by way of FIG. 3, which is a diagram illustrating a method 300 for generating a partial Cyclic Redundancy Checking (CRC) value of a first interval of data in a digital data stream. The method 300 includes the step of loading a precomputed CRC value corresponding to the one bit followed by a predetermined number of zeros (block 310). The predetermined number of zeros correspond to the number of digits of a polynomial (e.g., generating polynomial) minus one (i.e., the degree of the polynomial). The first interval of data is partitioned into a plurality of bits (block 312). The precomputed CRC value corresponding to the one bit followed by the predetermined number of zeros is enabled, for each of the plurality of bits having a value of one (block 314). The enabled, precomputed CRC values are combined to generate the partial CRC value of the first interval of data (block 316).

Figure 4:
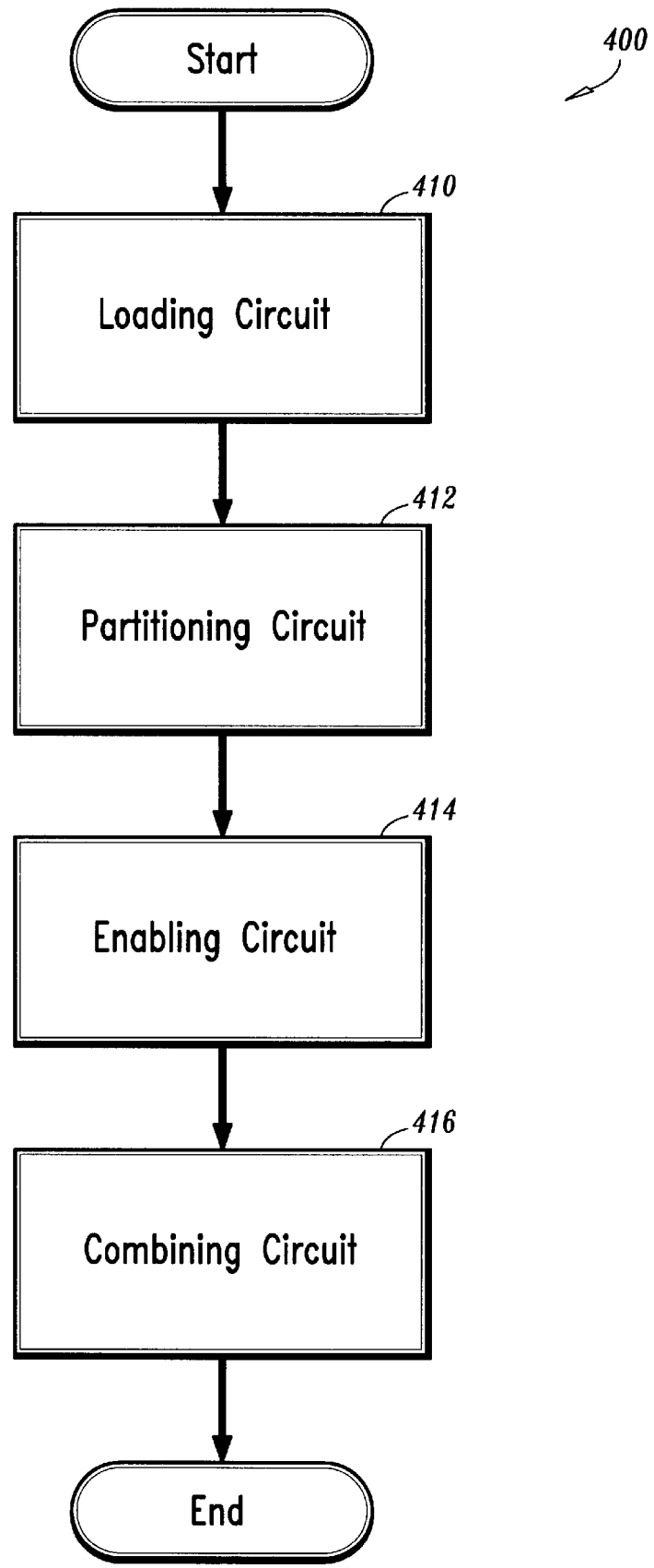
FIG. 4 is a diagram illustrating a system for generating a partial Cyclic Redundancy Checking (CRC) value of a first interval of data in a digital data stream according to an illustrative embodiment of the present invention.

FIG. 4 is a diagram illustrating a system 400 for generating a partial Cyclic Redundancy Checking (CRC) value of a first interval of data in a digital data stream. The system 400 includes a loading circuit 410 for loading a precomputed CRC value corresponding to a one bit followed by a predetermined number of zeros. The predetermined number of zeros correspond to the number of digits of a polynomial minus one (i.e., the degree of the polynomial). A partitioning circuit 412 partitions the first interval of data into a plurality of bits. An enabling circuit 414 enables the precomputed CRC value corresponding to the one bit followed by the predetermined number of zeros, for each of the plurality of bits having a value of one. A combining circuit 416 combines the enabled, precomputed CRC values to generate the partial CRC value of the first interval of data.

Figure 5:
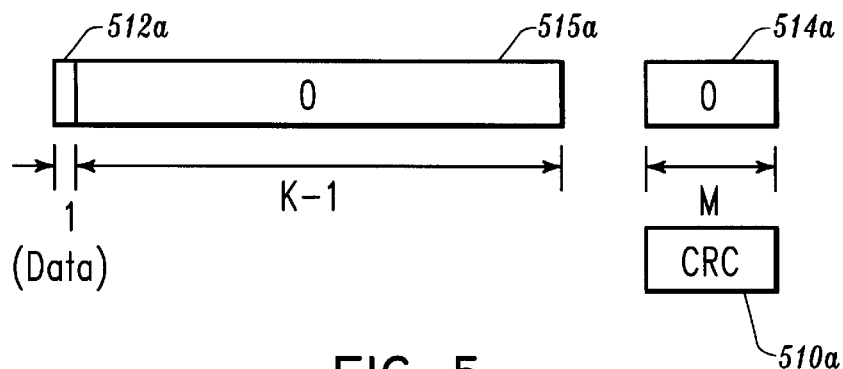
FIG. 5 is a diagram illustrating the alignment of an M-bit (length) CRC of a data bit with the last M-bits (zeros) of a sequence of bits that consist of the data bit followed by (K–1+M) zeros according to an illustrative embodiment of the present invention.

A more detailed description of the present invention and various embodiment thereof will now be given. The following simple relation is employed with respect to the present invention, $$CRC\left(\sum_i X_i\right) = CRC\left(\sum_i CRC(X_i)\right),$$

where $X_i$ is the data to be processed. Suppose we want to calculate an M-bit CRC of data. FIG. 5 is a diagram illustrating the alignment of an M-bit (length) CRC 510 of a data bit 512 with the last M-bits (zeros) 514 of a sequence of bits that consist of the data bit 512 followed by (K−1+M) 515,514 zeros according to an illustrative embodiment of the present invention.

Figure 6:
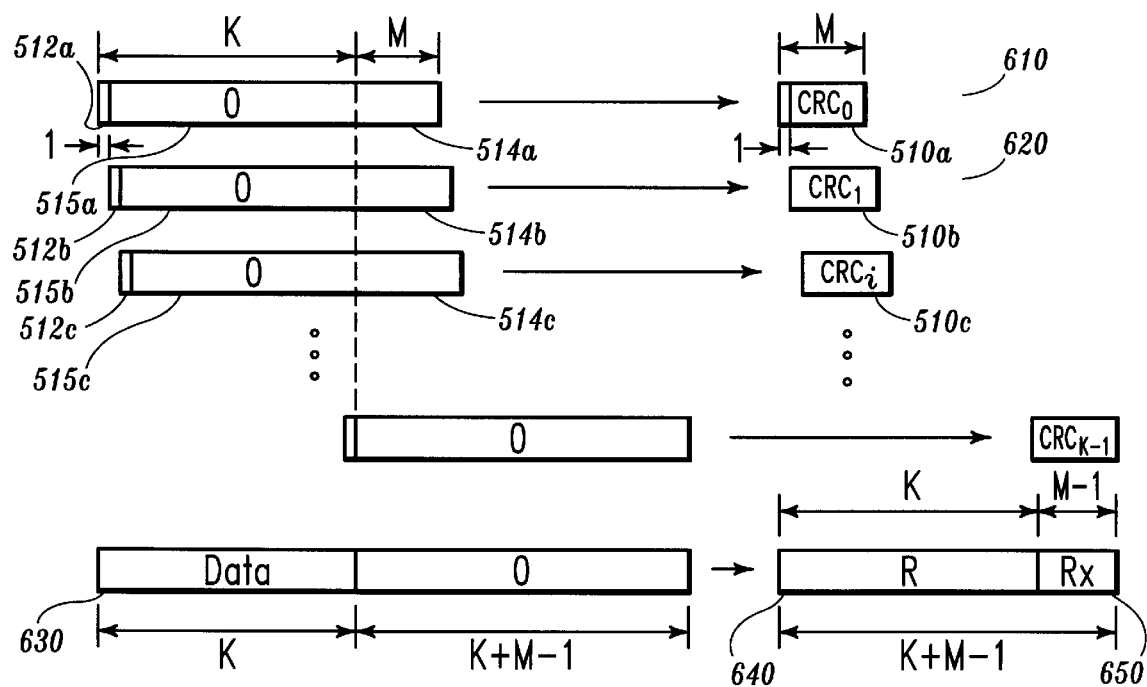
FIG. 6 is a diagram illustrating the adding of the CRC of each bit of data according to an illustrative embodiment of the present invention.

This computation corresponds to the CRC computation shown in the first row 610 of FIG. 6, which is a diagram illustrating the adding of the CRC 510a–c of each bit of data 512a–c according to an illustrative embodiment of the present invention. Now consider the next data bit 512b, also followed by (K−1+M) 515b, 514b zeros. Its M-bit CRC 510b will be aligned with its last M bits 514b. Since the second data bit 512b is aligned one position to the right of the first data bit 512a, its CRC 510b will be aligned one position to the right of the CRC 510a of the first data bit 512a. This is shown in the second row 620 of FIG. 6. Therefore, the CRC of the first two bits, followed by (K−1+M) zeros, is the CRC of the sum of the two CRCs on the right, with the second CRC shifted right by 1 bit.

Proceeding similarly, we align the CRCs of the K data bits 630, each followed by (K−1+M) zeros, and add them. Therefore, the CRC of these K bits of data, followed by (K−1+M) zeros, is the CRC of the sum of the CRCs on the right side in FIG. 6. The CRC of the ith bit (followed by (K−1+M) zeros) is denoted via $CRC_i$ 510c in the figure. Note that a summation in modulo-2 arithmetic is equivalent to an XOR operation. This completes one iteration. Let the first K bits of the sum of the CRCs be denoted by R 640, and the remaining (M−1) bits denoted by Rx 650. Using these, we denote the sum of the CRCs as (R, Rx). The sum of the CRCs is aligned to the immediate right of the K data bits. Unlike conventional CRC generation algorithms, the present invention does not obtain the CRC of the data at the end of each iteration.

Figure 7:
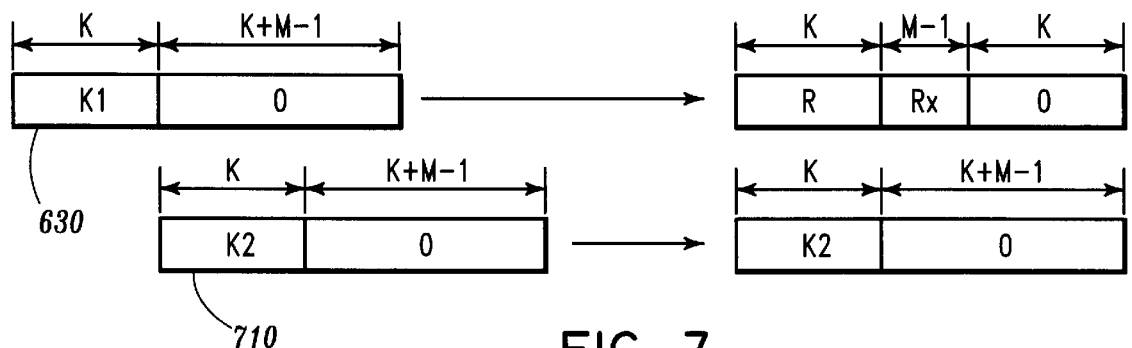
FIG. 7 is a diagram illustrating the CRC of 2K data bits (K1 and K2) followed by (K–1+M) zeros according to an illustrative embodiment of the present invention.

Now consider the next K bits of data 710. These are aligned to the right of the first K data bits 630. CRC of these 2K bits of data followed by (K−1+M) zeros is the CRC of the sum of (R, Rx) 640,650 of the first K data bits followed by K zeros and the last K data bits 710 followed by (K−1+M) zeros. This is shown graphically in FIG. 7, which is a diagram illustrating the CRC of 2K data bits (K1 and K2) followed by (K−1+M) zeros according to an illustrative embodiment of the present invention.

Figure 8:
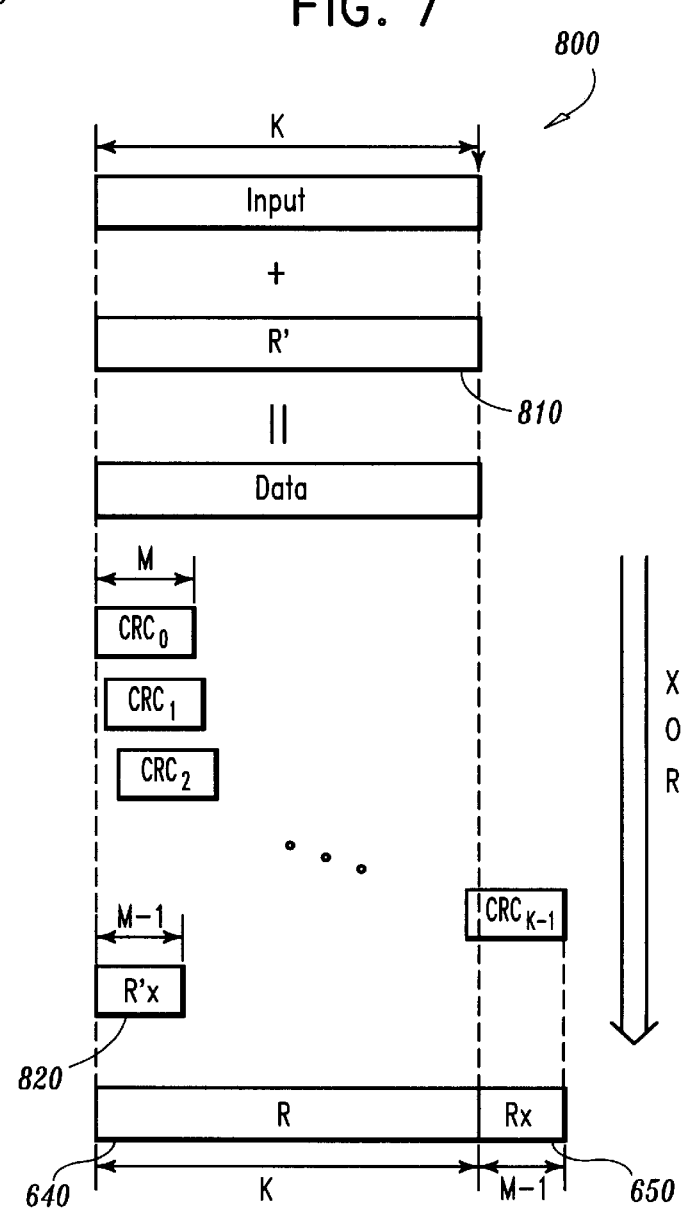
FIG. 8 is a diagram illustrating a system/method for generating a partial CRC value of an interval of data in a digital data stream according to another illustrative embodiment of the present invention.

Therefore, the input of the second iteration is the sum of the second set of K bits 710 and R 640 from the first iteration. To compute (R, Rx) for the second iteration, the shifted CRCs are summed with Rx 650 of the first iteration, which is aligned with the first CRC. Graphically, this system/method 800 is shown in FIG. 8, where (R, Rx) 640,650 from the previous iteration are denoted by (R', R'x) 810,820.

Figure 9:
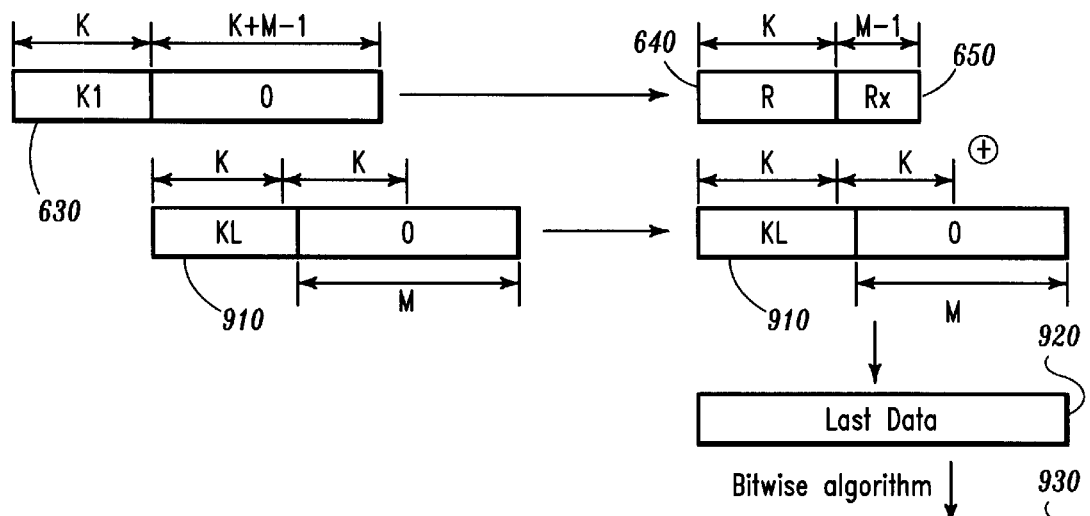
FIG. 9 is a diagram illustrating the computation performed after the last iteration of the system/method of FIG. 8 according to a illustrative embodiment of the present invention.

For the first iteration, the input is the first K data bits, and (R', R'x) is zero. Each subsequent iteration uses (R, Rx) from the previous iteration as (R',R'x) in FIG. 8. Thus, in each iteration, K bits are processed. The bits processed do not include the M zero bits suffixed to the entire data. The iterations continue until the number of bits remaining, KL 910, are between K and 2K. These bits are then appended with M zeros. This segment is then summed with (R, Rx) of the last iteration, appended with zeros to make its length the same as the last segment of bits followed by M zeros, to generate the last data 920. The CRC of the result 930 is then computed using any of the existing CRC algorithms. The last step is shown in FIG. 9, which is a diagram illustrating the computation performed after the last iteration of the method of FIG. 8 according to another illustrative embodiment of the present invention.

A description of the speed-ups and complexity of the method of the present invention will now be given. For each bit in the K-bit input segment of each iteration, the CRC is a non-zero constant only if the bit is 1. Therefore, the CRC of a bit followed by (K−1+M) zeros is obtained by ANDing the input bit with a constant CRC. Thus, the K CRCs can be obtained in one clock cycle. Assume we can perform an XOR operation with any number of inputs in one clock cycle. A discussion of the implications of using only 2-input XOR operations is provided hereinbelow. All the XOR operations, therefore, can be performed in the next clock cycle to obtain (R, Rx). This R and the next K data bits are XORed in the next clock cycle to obtain the input for the next iteration. Thus, each iteration is completed in 3 cycles. Since the traditional bit-wise algorithm would have taken K clock cycles to process K bits, we have a speed-up factor of K/3.

It is to be appreciated that the present invention can be further speeded up. It can be seen from FIG. 8 that the mth bit of (R,Rx), $0 \leq m \leq K+M-1$, is obtained via $$(R, Rx)(m) = \sum_{i=\max(0,m-M)}^{\min(m,K-1)} X(i)CRC(m - i), \quad (2)$$

where X(i) is the ith input bit in the current iteration. Therefore, we need to XOR only those X(i) for which CRC (m−i) is 1. Since the CRC is already known, we can eliminate the AND operation between X(i) and the CRC. Thus, each iteration can be performed in 2 cycles. Accordingly, the resulting speedup factor is K/2. The actual speedup is likely to be a little bit smaller than this, since the last stage of computation after all the iterations was not taken into account.

All the current CRC algorithms limit the number of bits processed in each iteration to M. In contrast, the CRC generation system and method of the present invention does not impose any such limit. Naturally, the price for speeding up is added complexity.

A significant complexity factor in the system and method of the present invention is the XOR gate/operation. The maximum number of inputs for an XOR gate is one more than the number of is in each CRC (the one extra input is for an element from Rx). The maximum number of inputs to an XOR gate can be reduced using a technique described by R. J. Glaise, IN "A Two-step Computation Cyclic Redundancy Code CRC-32 for ATM networks", IBM Journal Research and Development, Vol. 41, No. 6, pp. 705–09, November 1997. According to this technique, the generating polynomial g(x) need not be used to generate the CRCs. Rather, a "simpler" polynomial m(x)g(x) can be used, which has a lesser number of 1s. This technique does not require any extra computations since, as stated above, the CRC of the data at the end of each iteration is not needed.

The number of inputs per XOR gate can be further reduced by spreading the operations over more than 1 cycle. If we have only 2-input XOR gates available, and the maximum number of inputs to an XOR gate is P, then the XOR operation will take $\log_2 P$ cycles. Thus, the speed-up factor will be reduced to $K/(1+\log_2 P)$. A speed-up factor of K can still be obtained by running multiple copies of the method of the present invention (or implementing multiple systems of the present invention) as described below.

Figure 10:
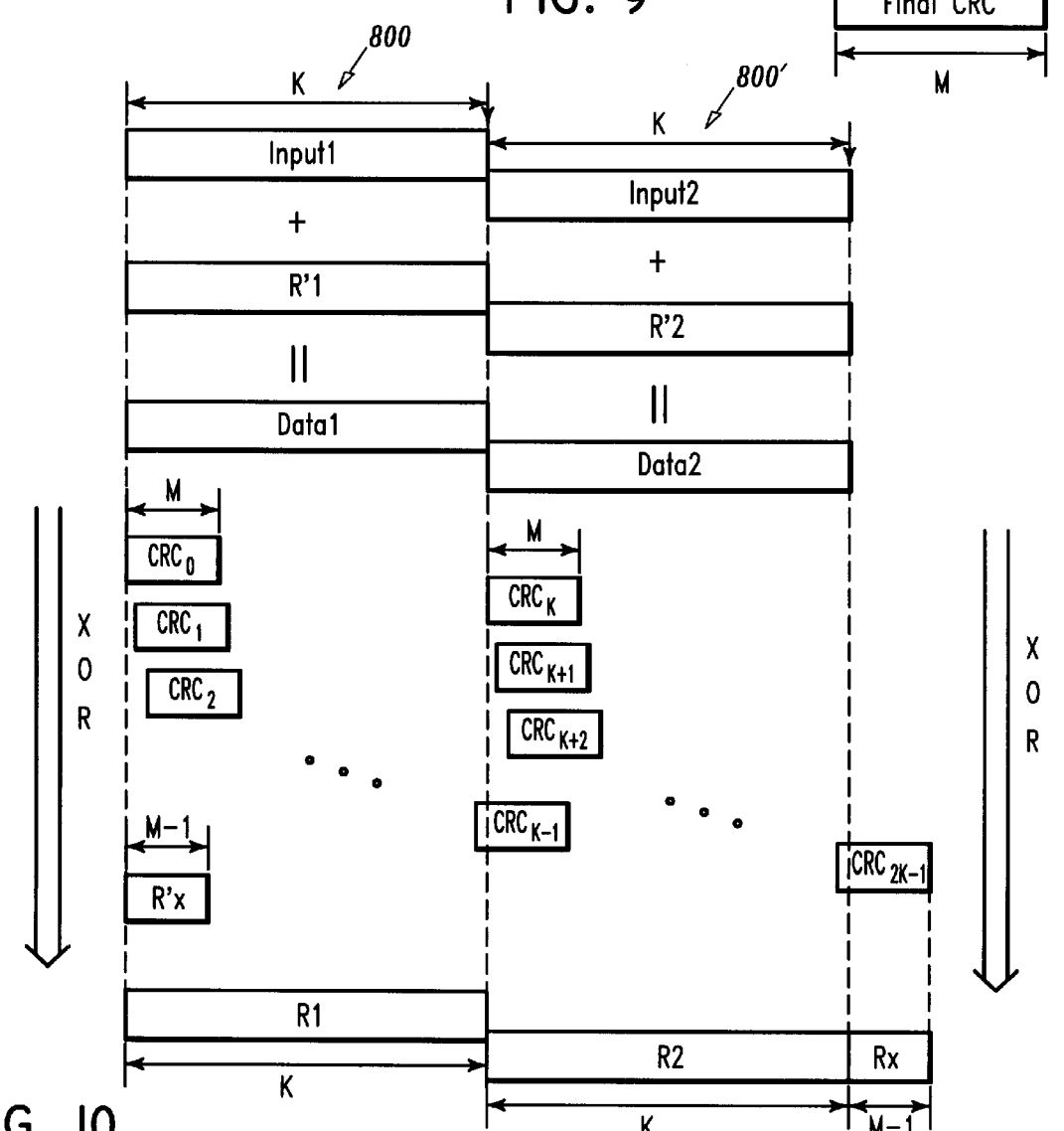
FIG. 10 is a diagram illustrating a parallel implementation of the system/method of FIG. 8.

The most convenient value for K is probably the number of data bits delivered by a parallel bus in one cycle. We can obtain a speedup of K using a technique shown in FIG. 10, which is a diagram illustrating a parallel implementation of the system/method 800 of FIG. 8. Effectively, we have two copies 800,800' of the system/method of the present invention operating in parallel (or two versions of the system of the present invention). The left-half takes 2 cycles to compute R1 as discussed earlier. In the first cycle, its input is XORed with a remainder R1 from the previous iteration of the left-half, denoted as R'1 in FIG. 10. While this is being done, the right-half sums the CRCs to obtain R2 and Rx. In the next cycle, the left-half sums the CRCs with Rx of the previous iteration, denoted as R'x, to obtain a new R1, while the right-half XORs the next data segment with R2 of the previous iteration, denoted as R'2 in FIG. 10. Therefore, the effective speedup is achieved by a factor of K.

Suppose we had only 2-input XOR gates available. Each copy of the method/system of the present invention will then need $(1+\log_2 P)$ cycles to complete, as described above. Then, $(1+\log_2 P)$ copies of the method/system of the present invention can be run, similar to the 2-copy technique described above, to obtain a speed-up factor of K.

The present invention is directed to a parallel system and method for CRC generation. The present invention allows for speed-up factors to be obtained well beyond the CRC size, by processing K bits of data in one iteration. The number of bits processed per cycle is usually limited by the width of the data bus. The present invention increases the speed-up to a factor of K, the number of bits that can be delivered per cycle.

The present invention may be utilized in a communication system wherein data is communicated between a source node and a target node over a communication link. In such a system, the source node calculates the CRC of the data to be transferred over the link using a predetermined polynomial. The source node then transmits the data along with the CRC over the link target node. The target node receives the data, independently generates the CRC of the received data using the predetermined polynomial, a compares the independently generated CRC with the CRC received from the source node. If the two CRC values match, then no error is presumed to have occurred during the transmission.

However, if the two CRC values do not match, then an error is presumed to have occurred during the transmission. In this case, the target node may utilize error correction techniques to correct errors that have occurred during transmission and/or request re-transmission of the data by the source node. The present invention as described above may be utilized by the source node and/or the target node to calculate the CRC of the data using the predetermined polynomial.

In addition, the present invention may be used in a data processing system wherein data is transferred via an I/O bus from a storage device to memory for access by devices of the data processing system. In such a storage device, the storage device calculates the CRC of the data o be transferred over the I/O bus using a predetermined polynomial. The storage device then transmits the data along with the CRC over the I/O bus to memory. A processing unit independently generates the CRC of the received data using the predetermined polynomial, and compares the independently generated CRC with the CRC received from the storage device. If the two CRC values match, then no error is presumed to have occurred during the transmission. However, if the two CRC values do not match, then an error is presumed to have occurred during the transmission. In the later case, the processing unit may utilize error correction techniques to correct errors that have occurred during transmission and/or request re-transmission of the data by the storage device. The present invention as described above may be used by the storage device and/or the processing unit to calculate the CRC of the data using the predetermined polynomial.

As the internet continues its explosive growth, faster and faster networks will evolve. Accordingly, the present invention provides a fast CRC computation system and method that can be scaled for any CRC size, any polynomial, and any speed-up desired. Given the simplicity of the system and method of present invention, it should be more easily implemented by one of ordinary skill in the related art than conventional algorithms. Moreover, given the teachings of present invention provided herein, one of ordinary skill in the related art will contemplate these and other implementations of the elements of the present invention.

Although the illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method for generating a partial Cyclic Redundancy Checking (CRC) value of a first interval of data in a digital data stream, comprising the steps of:
    loading a precomputed CRC value corresponding to a one bit followed by a predetermined number of zeros, the predetermined number of zeros corresponding to a number of digits of a polynomial minus one;
    partitioning the first interval of data into a plurality of bits;
    enabling the precomputed CRC value corresponding to the one bit followed by the predetermined number of zeros, for each of the plurality of bits having a value of one; and
    combining the enabled, precomputed CRC values to generate the partial CRC value of the first interval of data.

2. The method according to claim 1, wherein said enabling step comprises the step of performing an AND operation between each of the plurality of bits and the precomputed CRC value corresponding to the one bit followed by the predetermined number of zeros, respectively.

3. The method according to claim 1, wherein said loading and enabling steps are performed concurrently for each of the plurality of bits.

4. The method according to claim 1, further comprising the step of computing the CRC value corresponding to the one bit.

5. The method according to claim 4, wherein said computing step comprises the steps of:
    appending a same number of zeros to the one bit as the number of digits of the polynomial minus one; and
    determining a remainder of a division operation wherein the given bit of data followed by the same number of zeros is a dividend and the polynomial is a divisor.

6. The method according to claim 1, wherein said combining step comprises the step of performing XOR operations with respect to the enabled, precomputed CRC values.

7. The method according to claim 1, further comprising the step of generating a CRC value of a second interval of data in the digital data stream.

8. The method according to claim 7, wherein said generating step comprises the step of:
    performing an XOR operation between the second interval of data and the partial CRC value of the first interval of data; and
    performing an XOR operation between least significant M−1 bits from the partial CRC value of the first interval and most significant M−1 bits of a CRC value of a first bit from the second interval of data, wherein M corresponds to a number of digits of the CRC value corresponding to the one bit.

9. The method according to claim 1, further comprising the step of executing a copy of said method to generate a CRC value of a second interval of data in the digital data stream.

10. The method according to claim 9, further comprising the step of executing said method and the copy thereof substantially in parallel.

11. The method according to claim 1, further comprising the step of executing a same number of copies of said method as intervals of data in the digital data stream to generate partial CRC values of the intervals of data in the digital data stream.

12. The method according to claim 11, further comprising the step of executing said method and the copies thereof substantially in parallel.

13. A program storage device readable by machine, tangibly embodying a program of instructions executable by the machine to perform steps for generating a partial Cyclic Redundancy Checking (CRC) value of a first interval of data in a digital data stream, said method steps comprising:
    loading a precomputed CRC value corresponding to a one bit followed by a predetermined number of zeros, the predetermined number of zeros corresponding to a number of digits of a polynomial minus one;
    partitioning the first interval of data into a plurality of bits;
    enabling the precomputed CRC value corresponding to the one bit followed by the predetermined number of zeros, for each of the plurality of bits having a value of one; and
    combining the enabled, precomputed CRC values to generate the partial CRC value of the first interval of data.

14. The program storage device according to claim 13, wherein said enabling step comprises the step of performing an AND operation between each of the plurality of bits and the precomputed CRC value corresponding to the one bit followed by the predetermined number of zeros, respectively.

15. The program storage device according to claim 13, wherein said loading and enabling steps are performed concurrently for each of the plurality of bits.

16. The program storage device according to claim 13, further comprising the step of computing the CRC value corresponding to the one bit.

17. The program storage device according to claim 16, wherein said computing step comprises the steps of:
appending a same number of zeros to the one bit as the number of digits of the polynomial minus one; and
determining a remainder of a division operation wherein the given bit of data followed by the same number of zeros is a dividend and the polynomial is a divisor.

18. The program storage device according to claim 13, wherein said combining step comprises the step of performing XOR operations with respect to the enabled, precomputed CRC values.

19. The program storage device according to claim 13, further comprising the step of generating a CRC value of a second interval of data in the digital data stream.

20. The program storage device according to claim 19, wherein said generating step comprises the step of:
performing an XOR operation between the second interval of data and the partial CRC value of the first interval of data; and
performing an XOR operation between least significant M−1 bits from the partial CRC value of the first interval and most significant M−1 bits of a CRC value of a first bit from the second interval of data, wherein M corresponds to a number of digits of the CRC value corresponding to the one bit.

21. The program storage device according to claim 13, further comprising the step of executing a copy of said method to generate a CRC value of a second interval of data in the digital data stream.

22. The program storage device according to claim 21, further comprising the step of executing said method and the copy thereof substantially in parallel.

23. The program storage device according to claim 13, further comprising the step of executing a same number of copies of said method as intervals of data in the digital data stream to generate partial CRC values of the intervals of data in the digital data stream.

24. The program storage device according to claim 23, further comprising the step of executing said method and the copies thereof substantially in parallel.

25. A system for generating a partial Cyclic Redundancy Checking (CRC) value of a first interval of data in a digital data stream, comprising:
a loading circuit for loading a precomputed CRC value corresponding to a one bit followed by a predetermined number of zeros, the predetermined number of zeros corresponding to a number of digits of a polynomial minus one;
a partitioning circuit for partitioning the first interval of data into a plurality of bits;
an enabling circuit for enabling the precomputed CRC value corresponding to the one bit followed by the predetermined number of zeros, for each of the plurality of bits having a value of one; and
a combining circuit for combining the enabled, precomputed CRC values to generate the partial CRC value of the first interval of data.

26. The system according to claim 25, wherein said enabling circuit comprises at least one AND gate for performing an AND operation between each of the plurality of bits and the precomputed CRC value corresponding to the one bit followed by the predetermined number of zeros, respectively.

27. The system according to claim 25, wherein said loading circuit and enabling circuit are operated concurrently for each of the plurality of bits.

28. The system according to claim 25, further comprising a computing circuit for computing the CRC value corresponding to the one bit.

29. The system according to claim 28, wherein said computing circuit comprises:
an appending circuit for appending a same number of zeros to the one bit as the number of digits of the polynomial minus one; and
a determining circuit for determining a remainder of a division operation wherein the given bit of data followed by the same number of zeros is a dividend and the polynomial is a divisor.

30. The system according to claim 25, wherein said combining circuit comprises at least one XOR gate for performing XOR operations with respect to the enabled, precomputed CRC values.

31. The system according to claim 25, further comprising a CRC generating circuit for generating a CRC value of a second interval of data in the digital data stream.

32. The system according to claim 31, wherein said generating circuit comprises at least one XOR gate for performing an XOR operation between the second interval of data and the CRC value of the first interval of data, and performing an XOR operation between least significant M−1 bits from the CRC value of the first interval and most significant M−1 bits of a CRC value of a first bit from the second interval of data, wherein M corresponds to a number of digits of the CRC value corresponding to the one bit.

33. The system according to claim 25, further comprising at least a second loading circuit, a second partitioning circuit, a second enabling circuit, and a second combining circuit, for generating a CRC value of at least a second interval of data in the digital data stream.

* * * * *